United States Patent
Cok

(10) Patent No.: US 9,085,194 B2
(45) Date of Patent: Jul. 21, 2015

(54) EMBOSSING STAMP FOR OPTICALLY DIFFUSE MICRO-CHANNEL

(71) Applicant: Ronald Steven Cok, Rochester, NY (US)

(72) Inventor: Ronald Steven Cok, Rochester, NY (US)

(73) Assignee: EASTMAN KODAK COMPANY, Rochester, NY (US)

(*) Notice: Subject to any disclaimer, the term of this patent is extended or adjusted under 35 U.S.C. 154(b) by 85 days.

(21) Appl. No.: 13/847,506

(22) Filed: Mar. 20, 2013

(65) Prior Publication Data

US 2014/0283698 A1    Sep. 25, 2014

(51) Int. Cl.

| | | |
|---|---|---|
| *B31F 1/07* | (2006.01) | |
| *B44B 5/02* | (2006.01) | |
| *B29C 33/42* | (2006.01) | |
| *G06F 3/044* | (2006.01) | |
| *G03F 7/00* | (2006.01) | |
| *B29C 33/38* | (2006.01) | |

(52) U.S. Cl.
CPC .............. *B44B 5/026* (2013.01); *B29C 33/3857* (2013.01); *B29C 33/424* (2013.01); *G03F 7/0002* (2013.01); *G06F 3/044* (2013.01); *B31F 1/07* (2013.01); *B31F 2201/07* (2013.01)

(58) Field of Classification Search
USPC ............................................................ 101/28
See application file for complete search history.

(56) References Cited

U.S. PATENT DOCUMENTS

| | | | | |
|---|---|---|---|---|
| 1,850,856 | A | * | 3/1932 | Weindel, Jr. .................... 101/32 |
| 2,343,191 | A | * | 2/1944 | Kinlein ....................... 101/401.1 |
| 3,247,785 | A | * | 4/1966 | Shultz ............................. 101/23 |
| 3,584,572 | A | * | 6/1971 | Apicella ......................... 101/24 |
| 6,604,457 | B2 | * | 8/2003 | Klug ................................ 101/32 |
| 6,819,316 | B2 | * | 11/2004 | Schulz et al. ................. 345/174 |
| 7,971,526 | B2 | * | 7/2011 | Blenke et al. ................... 101/23 |
| 8,179,381 | B2 | | 5/2012 | Frey et al. |
| 2010/0026664 | A1 | | 2/2010 | Geaghan |
| 2010/0328248 | A1 | | 12/2010 | Mozdzyn |
| 2011/0007011 | A1 | | 1/2011 | Mozdzyn |
| 2011/0099805 | A1 | | 5/2011 | Lee |

FOREIGN PATENT DOCUMENTS

CN          102063951          5/2011

* cited by examiner

*Primary Examiner* — Jill Culler

(74) *Attorney, Agent, or Firm* — Raymond L. Owens

(57) ABSTRACT

An embossing stamp includes a stamp substrate and one or more stamp structures formed on the stamp substrate. The stamp structures have stamp surfaces extending from the stamp substrate. At least one of the stamp surfaces is non-planar.

19 Claims, 29 Drawing Sheets

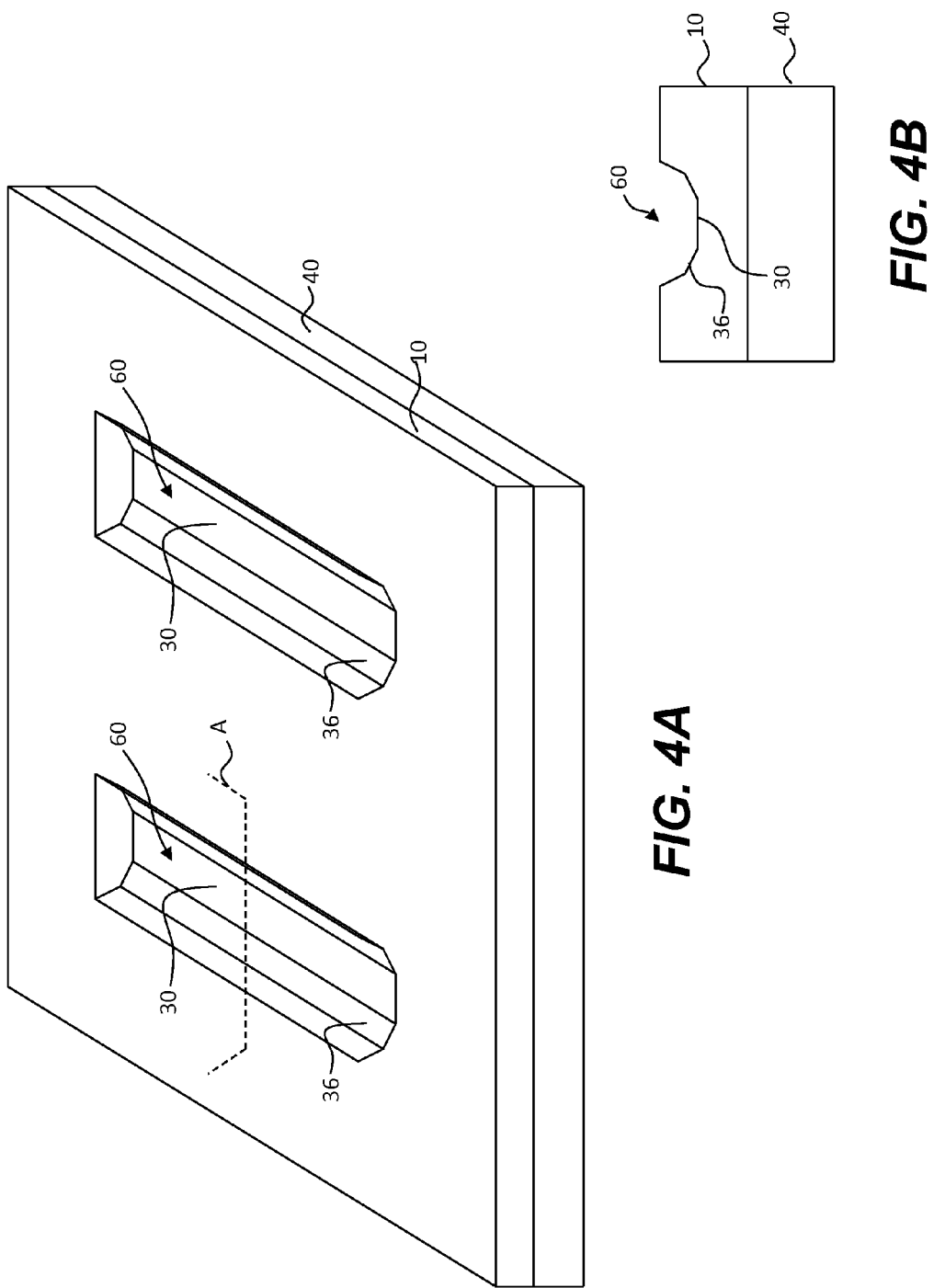

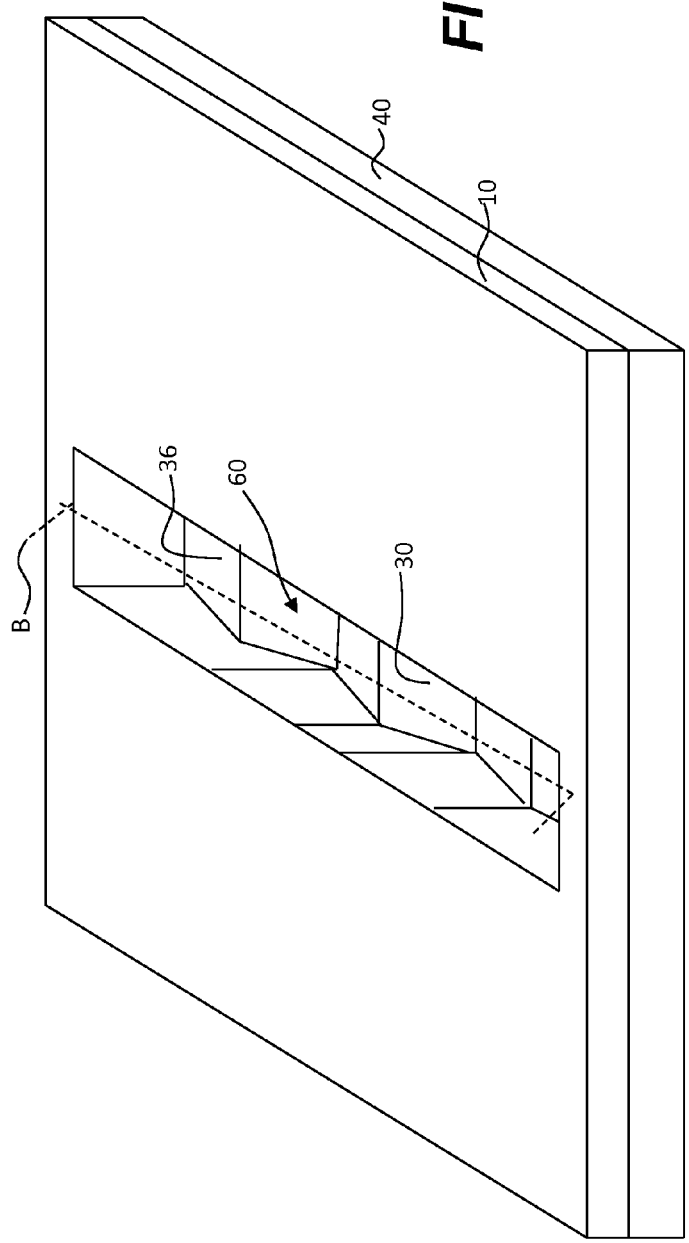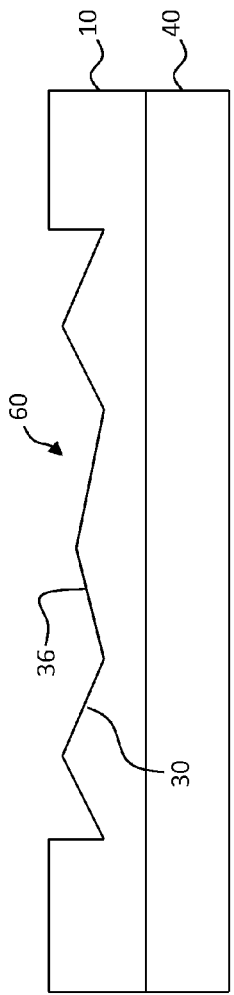

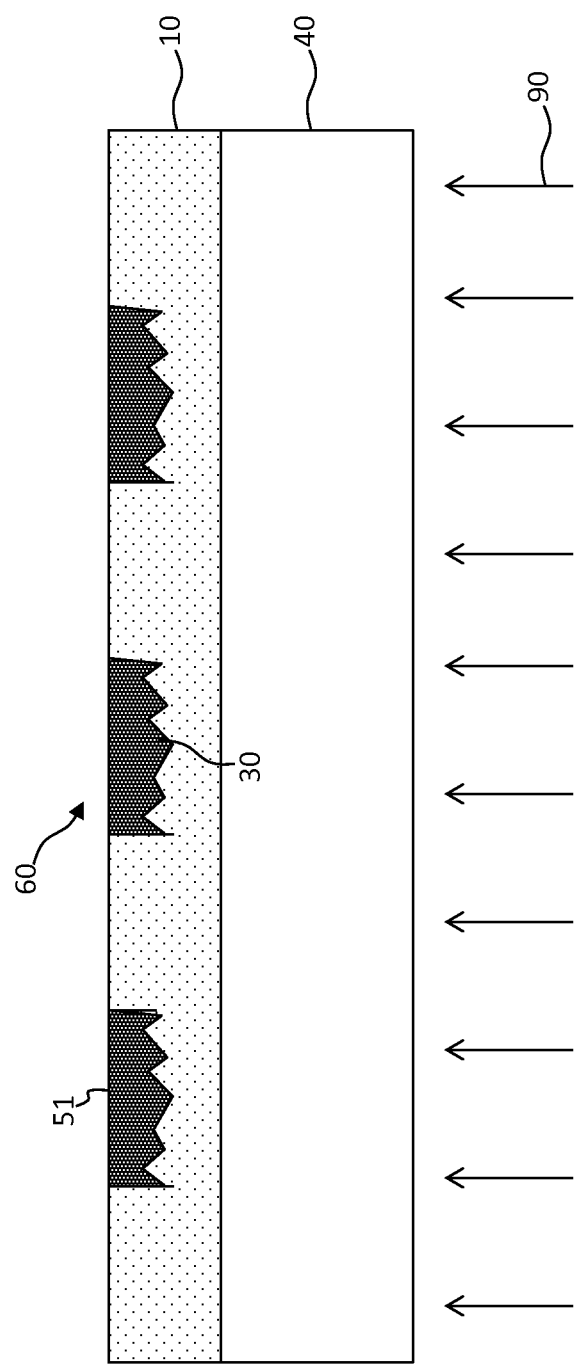

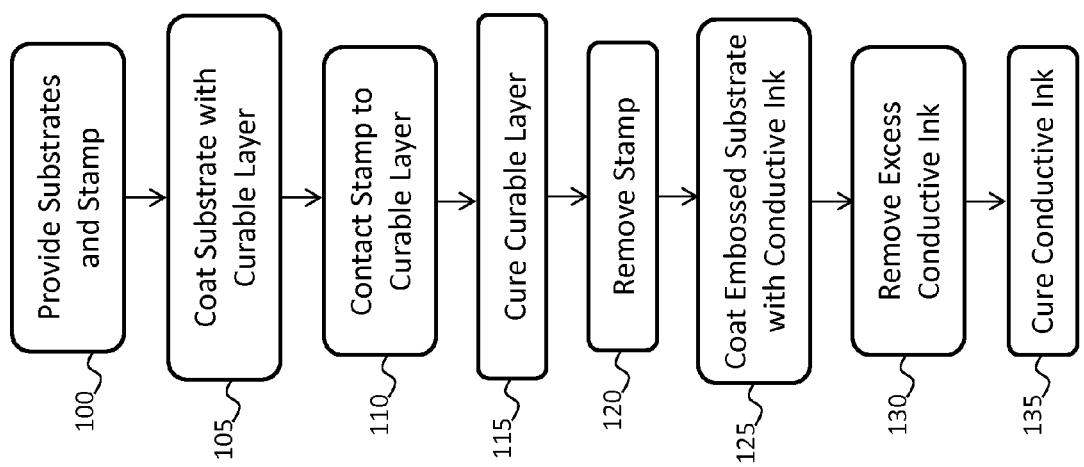

EMBOSSING STAMP FOR OPTICALLY DIFFUSE MICRO-CHANNEL

CROSS REFERENCE TO RELATED APPLICATIONS

Reference is made to commonly-assigned, co-pending U.S. patent application Ser. No. 13/847,504 filed Mar. 20, 2013, entitled "Optically Diffuse Micro-Channel" by Cok; commonly assigned U.S. patent application Ser. No. 13/784,866 filed Mar. 5, 2013 entitled "Variable-Depth Micro-Channel Structure" by Cok; and commonly assigned U.S. patent application Ser. No. 13/833,244 filed Mar. 15, 2013 entitled "Embossed Micro-Structure with Cured Transfer Material Method" by Cok et al; the disclosures of which are incorporated herein.

FIELD OF THE INVENTION

The present invention relates to transparent electrodes having micro-wires formed in light-controlling micro-channels.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch sensors on one side of a substrate is taught in U.S. Patent Application Publication No. 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes including very fine patterns of conductive elements, such as metal wires or conductive traces are known. For example, U.S. Patent Application Publication No. 2011/0007011 teaches a capacitive touch screen with a mesh electrode, as do U.S. Patent Application Publication No. 2010/0026664, U.S. Patent Application Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between $0.5\mu$ and $4\mu$ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels can be formed in a substrate using an embossing technique. Embossing methods are generally known in the prior art and typically include coating a curable liquid, such as a polymer, onto a rigid substrate. A pattern of micro-channels is embossed (impressed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

There is a need, however, for further improvements in transparency and manufacturability for micro-wires in transparent electrodes.

SUMMARY OF THE INVENTION

In accordance with the present invention, an embossing stamp comprises:
a stamp substrate; and
one or more stamp structures formed on the stamp substrate having stamp surfaces extending from the stamp substrate, wherein at least one of the stamp surfaces is non-planar.

The present invention provides a micro-wire with improved apparent transparency and manufacturability. The micro-wires of the present invention are particularly useful in transparent electrodes for capacitive touch screen and display devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 4A is a perspective of a micro-channel according to an embodiment of the present invention;

FIG. 4B is a cross section of the micro-channel of FIG. 4A according to an embodiment of the present invention;

FIG. 5A is a perspective of a micro-channel according to an embodiment of the present invention;

FIG. 5B is a cross section of the micro-channel of FIG. 5A according to an embodiment of the present invention;

FIGS. 11A-11D are cross sections illustrating sequential steps in a making a micro-wire of the present invention;

FIG. 12 is a flow diagram illustrating a method useful in the present invention;

The Figures are not drawn to scale since the variation in size of various elements in the Figures is too great to permit depiction to scale.

DETAILED DESCRIPTION OF THE INVENTION

The present invention is directed toward electrically conductive micro-wires formed in spaced-apart micro-channel structures in a substrate. The micro-channel structures control incident light to improve the apparent transparency of the micro-channel structures, for example by providing light absorption, refraction, reflection, or light diffusion in association with the micro-wires, thereby reducing the visibility of the micro-wires, and in particular reducing specular reflection from the micro-wires.

Figure 1:
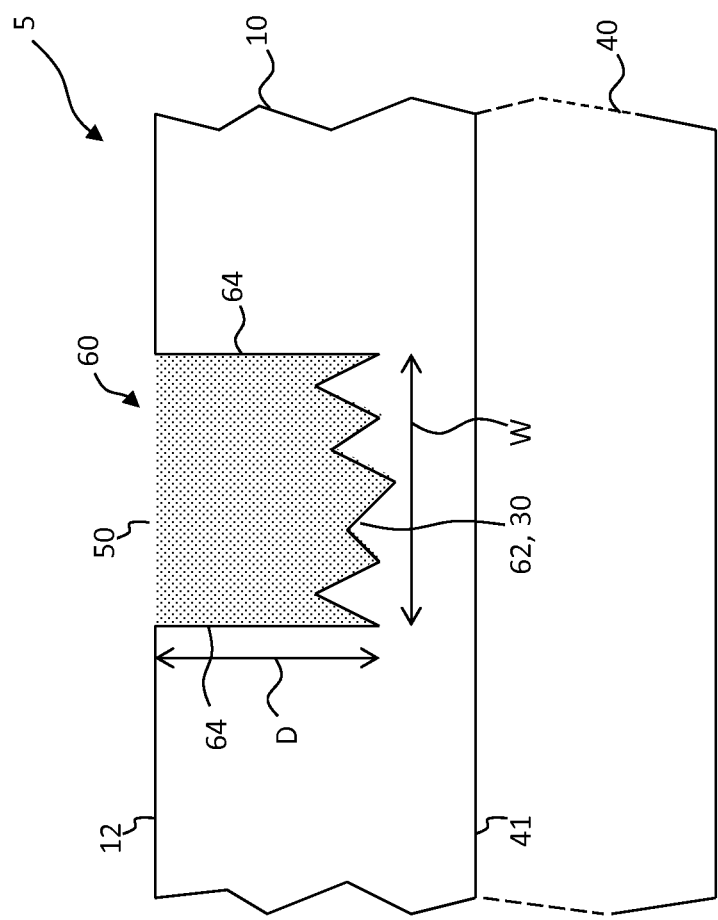
FIGS. 1-3 are cross sections of embossed micro-structures according to various embodiments of the present invention.

Referring to FIG. 1 in an embodiment of the present invention, an embossed micro-channel structure 5 includes a substrate 40 having a substrate surface 41. A cured layer 10 is formed on substrate surface 41 having a cured-layer surface 12 on a side of cured layer 10 opposite substrate surface 41. Cured layer 10 has one or more micro-channels 60 embossed therein. Micro-channel 60 extends from cured-layer surface 12 of cured layer 10 to a micro-channel bottom 62 of micro-channel 60 and toward substrate surface 41 of substrate 40. Micro-channel 60 has one or more micro-channel sides 64, a width W and depth D. At least one of micro-channel bottom 62 surface or micro-channel side 64 surfaces is a non-planar micro-channel surface 30. As indicated in the example of FIG. 1, micro-channel bottom 62 is a non-planar micro-channel surface 30. Because depth D of micro-channel 60 can have different values if micro-channel bottom 62 is non-planar, any of the depths or an average depth of micro-channel 60 can be depth D. Similarly, because width W of micro-channel 60 can have different values if one or more of micro-channel sides 64 is non-planar, any of the widths or an average width of micro-channel 60 can be width W.

A non-planar surface is a surface whose points are not all in a common plane. Some, but not all, of the points in a non-planar surface can be in a common plane or in a line. As used herein, portions of a non-planar surface that are in a plane are planar portions or facets.

A cured electrical conductor forms a micro-wire 50 in each micro-channel 60. In an embodiment, micro-wire 50 is adhered to micro-channel bottom 62 surface or one of micro-channel side 64 surfaces.

In various embodiments of the present invention, micro-wire 50 extends across micro-channel bottom 62, non-planar micro-channel surface 30 is micro-channel bottom 62, or non-planar micro-channel surface 32 is irregular, as shown. An irregular surface is one for which there is no regular, repeating pattern.

Figure 2:
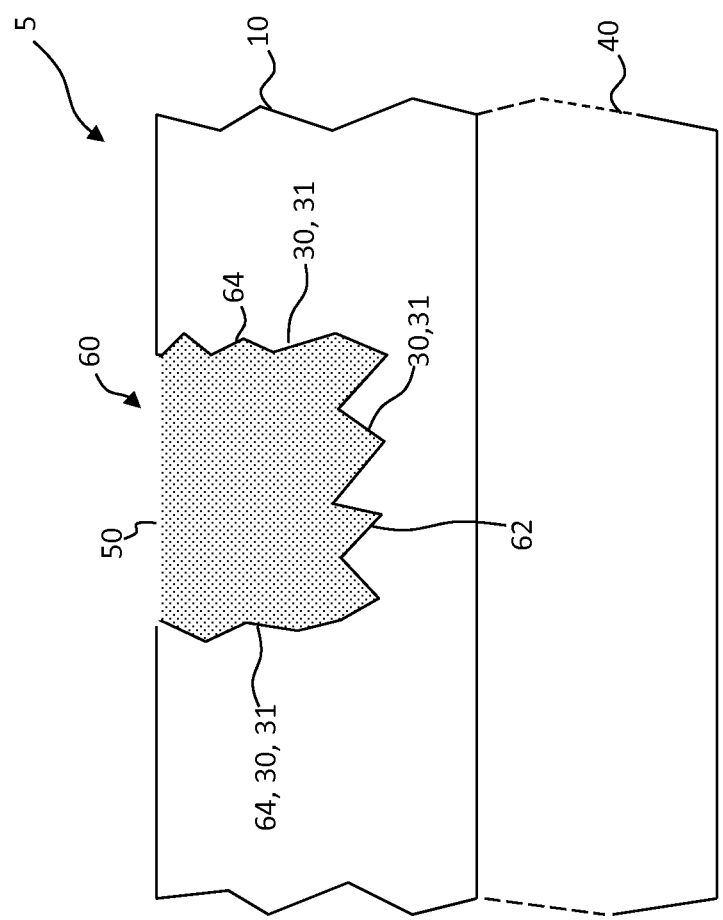

Alternatively, referring to FIG. 2, micro-channels 60 formed in cured layer 10 on substrate 40 in embossed micro-channel structure 5 of the present invention have micro-channel sides 64 forming a non-planar micro-channel surface 30. In the case of FIG. 2, both micro-channel sides 64 and micro-channel bottom 60 forms a non-planar micro-channel surface 30. In another embodiment, only micro-channel sides 64 form a non-planar micro-channel surface 30 (not shown). In any case, non-planar micro-channel surface 30 can have portions that are not parallel to cured-layer surface 12 or can have portions that are not orthogonal to cured-layer surface 12 or parallel to micro-channel sides 64.

Micro-wires 50 formed in micro-channels 60 having a non-planar micro-channel surface 30 can likewise have a non-planar surface. Since, in an embodiment, micro-wires 50 are deposited in micro-channels 60 in a liquid form and then cured, such as by drying or radiation, surfaces of micro-wires 50 can conform to non-planar micro-channel surface 30 and thus have a corresponding non-planar micro-wire surface 31, as shown, for example, in FIGS. 1 and 2. At least a portion of micro-wire 50 is therefore in contact with and has the shape of at least a corresponding portion of one of micro-channel bottom surface 62 or micro-channel side surfaces 64. Thus, in various embodiments, micro-wire 50 has a micro-wire bottom surface and one or more micro-wire side surface(s) and at least one of micro-wire bottom surface or micro-wire side surfaces is the non-planar micro-wire surface 31.

Figure 3:
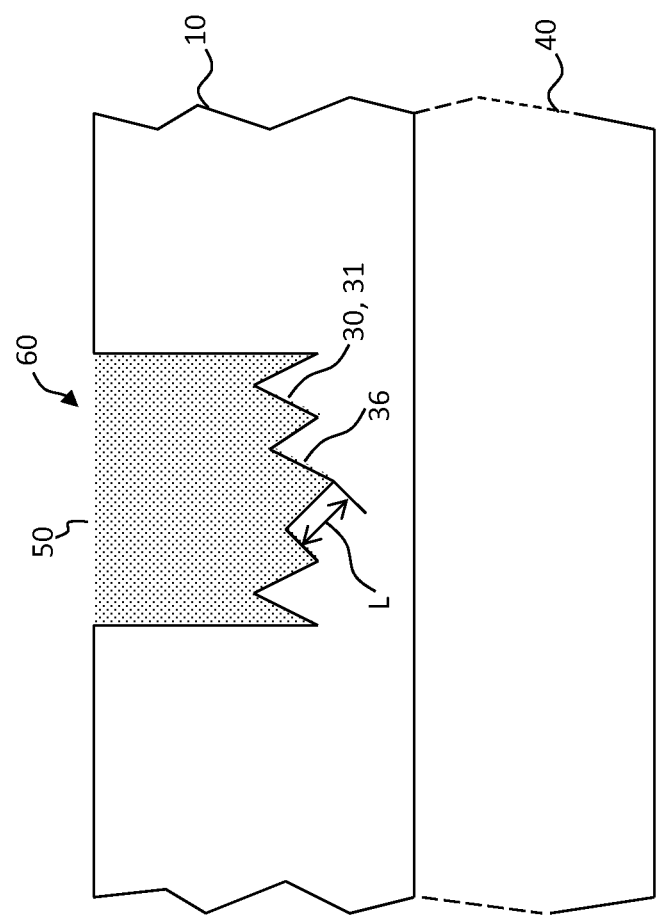

Micro-channel 60, micro-channel sides 64 or micro-channel bottom 62 can have non-planar micro-channel surfaces 30 in cross-section, for example as illustrated in FIGS. 1 and 2. Non-planar micro-channel surface 30 and non-planar micro-wire surface 31 of micro-channel 60 or micro-wire 50 formed in cured layer 10 on substrate 40 can have planar portions 36, for example facets having a length L in at least one dimension, as shown in FIG. 3. FIGS. 4A and 4B are a perspective (FIG. 4A) and cross section (FIG. 4B) taken across line A illustrating micro-channel 60 formed in cured-layer 10 on substrate 40 having planar portions 36 of non-planar micro-channel surface 30 in cross section. Alternatively, micro-channel 60, micro-channel sides 64 or micro-channel bottom 62 can have non-planar micro-channel surfaces 30 along their length in addition to or in place of a cross-section surface. As is known to those familiar with geometrical structures, a surface is typically two-dimensional. The present invention requires that micro-channel 60, micro-channel sides 64 or micro-channel bottom 62 is a non-planar surface. Planar portions 36 of non-planar micro-channel surface 30 can extend along the length of micro-channel 60 so that the surface of micro-channel 60 has long narrow planar portions 36. Referring to the perspective of FIG. 5A and corresponding cross section taken along line B of FIG. 5B, micro-channel 60 in cured-layer 10 has non-planar micro-channel surfaces 30 along its length forming long narrow planar portions 36. Alternatively, non-planar micro-channel surface 30 is broken up in two dimensions to form small planar polygonal facets, for example combining the structures of FIGS. 4A, 4B, 5A, and 5B (not shown).

Figure 6:
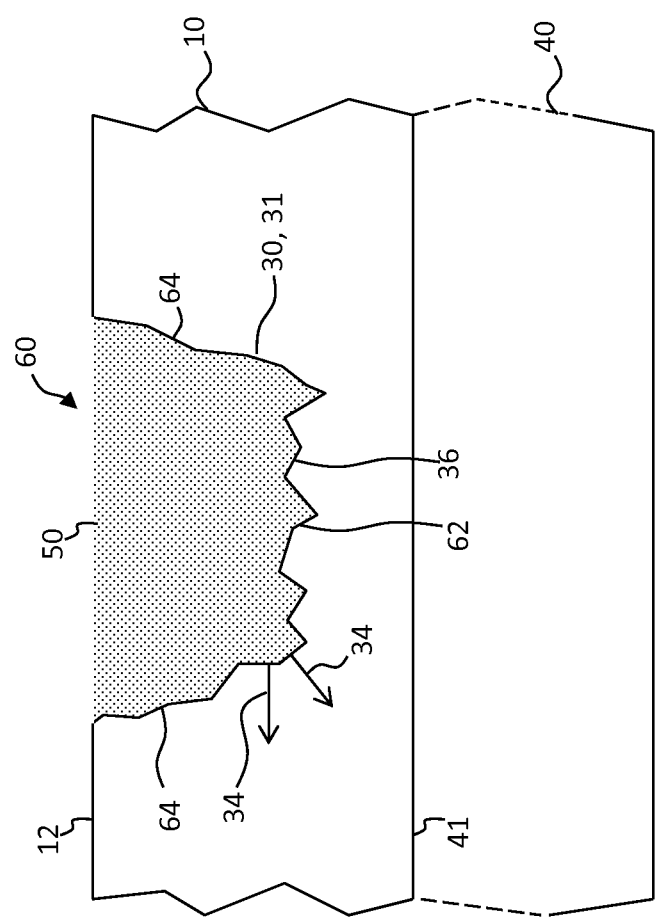
FIGS. 6 and 7 are cross sections of micro-channels according to various embodiments of the present invention.

Referring to FIG. 6, micro-channel 60 formed in cured layer 10 on substrate surface 41 of substrate 40 has a micro-channel bottom 62 and micro-channel sides 64 that are all non-planar micro-channel surfaces 30. Furthermore, micro-channel 60 is at least as wide or wider where it is closer to cured-layer surface 12 than where micro-channel 60 is farther from cured-layer surface 12. As is known in the geometric arts, a normal to a surface is a direction orthogonal to every portion of the surface. As shown in FIG. 6, surface normals 34 of planar portions 36 of non-planar micro-channel surface 30 are not parallel, thereby defining a non-planar surface for example of micro-channel bottom 62 or micro-channel sides 62. Likewise, micro-wire 50 in micro-channel 60 conforms to the surfaces of micro-channel 60 and has non-planar micro-wire surfaces 31.

Planar portions 36 of micro-channel bottom 62 and micro-channel sides 64 can have a variety of dimensions. In at least one embodiment, non-planar micro-channel surface 30 has planar portions 36 that have a dimension greater than 500 nm. In another embodiment, non-planar micro-channel surface 30 has planar portions 36 that have a dimension greater than 1 micron. As is understood in the optical arts, structure that are much smaller than the wavelength of visible light (e.g. less than 100 nm) do not necessarily scatter light effectively and structures that are much larger (e.g. greater than 100 microns) can provide significant specular reflection. Thus, a length or width dimension of planar portions 36 can be chosen to optimize light scattering of light incident on planar portions 36, thereby reducing the visibility of micro-wires 50 formed in micro-channels 60.

Figure 7:
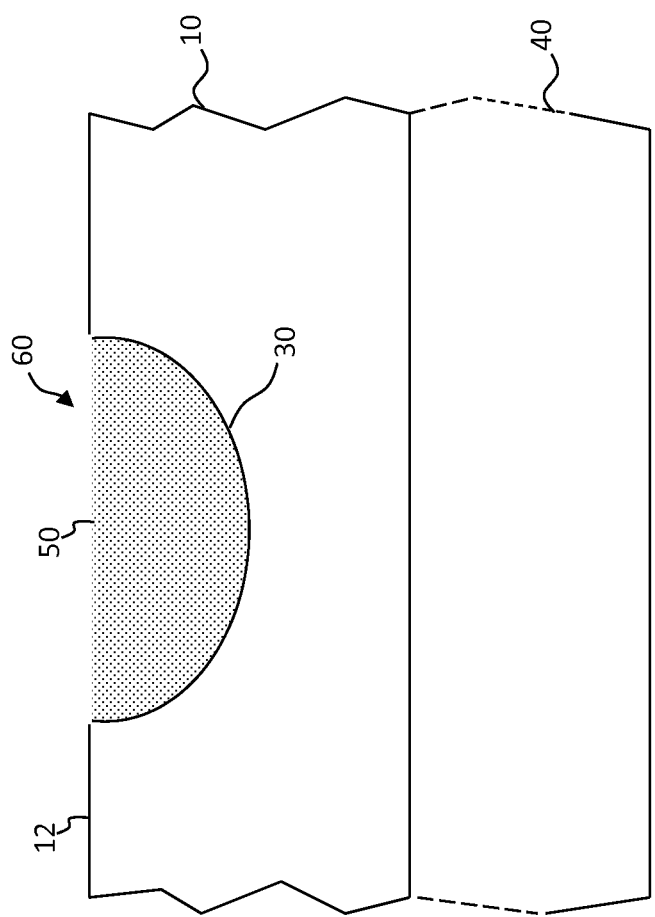

In a further embodiment illustrated in FIG. 7, non-planar micro-channel surface 30 of micro-channel 60 formed in cured layer 10 on substrate 40 is at least partially curved. Micro-wire 50 in micro-channel 60 can conform to non-planar micro-channel surface 30 of micro-channel 60 and have a corresponding partially curved surface.

By forming micro-channel sides 64 or micro-channel bottom 62 with irregular surfaces or surfaces that are not parallel to cured-layer surface 12, light incident on embossed micro-channel structure 5 will be reflected differently from micro-channel 60 than from cured-layer surface 12 or substrate surface 41, reducing specular reflection at a given angle to an observer. Similarly, reflections from micro-wire 50 at a given angle are reduced. Thus, both or either of micro-channel 60 and micro-wire 50 are incident-light diffusive.

In the embodiment illustrated in both FIGS. 6 and 7, micro-channel sides 64 are either vertical or lean into micro-channel 60 as the micro-channel surface moves farther away from cured-layer surface 12 so that no portion of the micro-channel surfaces is obscured or overhung by another. Therefore, an embossing stamp forming micro-channel 60 can be removed perpendicularly to cured-layer surface 12 from micro-channel 60 without contacting any portion of the micro-channel surfaces that was not formed by a corresponding stamp portion. This facilitates construction of micro-channel 60 and avoids damage to the stamp and to micro-channel 60.

Figure 8:
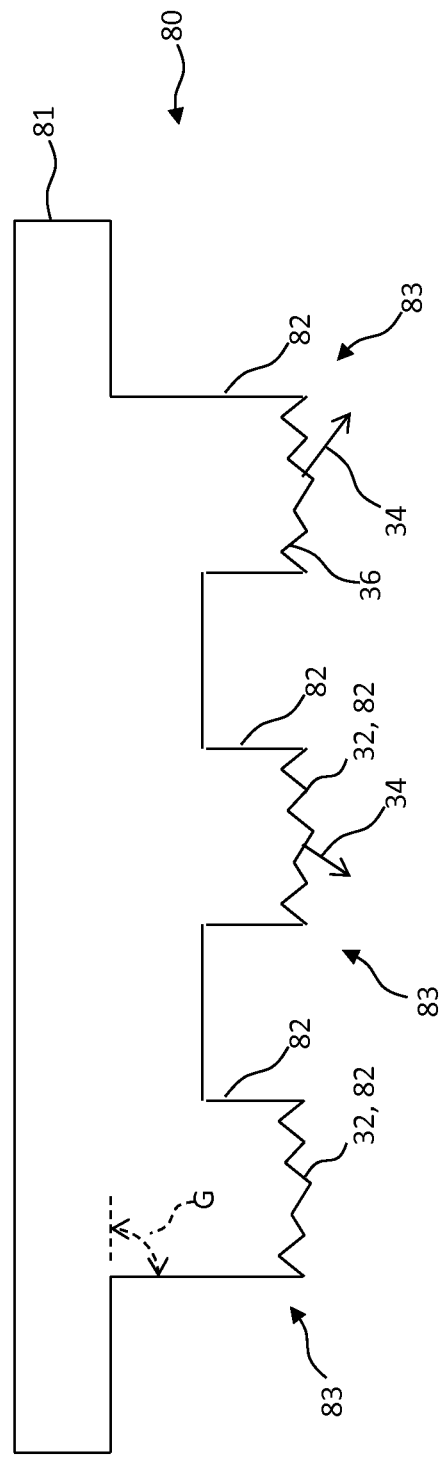
FIGS. 8 and 9 are cross sections of embossing stamps according to various embodiments of the present invention.

Referring to FIG. 8, an embossing stamp 80 includes a stamp substrate 81 having one or more stamp structures 83 formed on stamp substrate 81. Stamp structures 83 have stamp surfaces 82 extending from stamp substrate 81; at least one of stamp surfaces 82 is a non-planar stamp surface 32. As shown in the example of FIG. 8, stamp surfaces 82 protrude from stamp substrate 81 to form regular embossing stamp structures 83 whose bottoms form the non-planar stamp surface 32. Non-planar stamp surface 32 can have planar portions 36 with surface normals 34 that are not parallel to each other or to a surface of stamp substrate 81 of embossing stamp 80. In an embodiment, portions of stamp structures 83 closer to stamp substrate 81 are at least as wide as or wider than portions of stamp structures 83 farther from stamp substrate 81.

Figure 9:
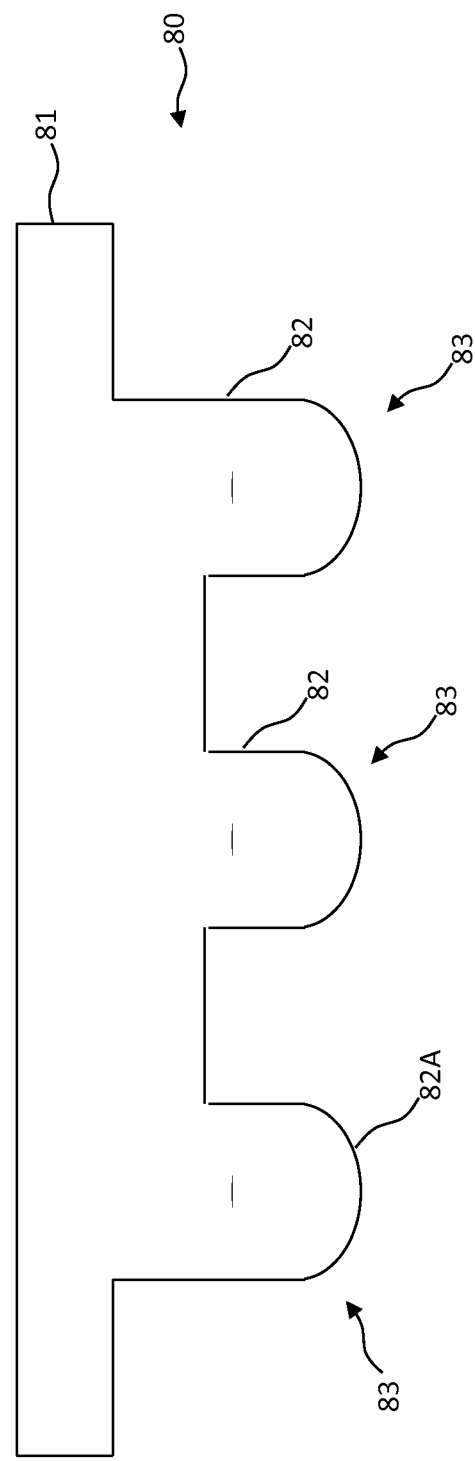

Planar portions 36 of stamp surfaces 82 correspond to planar surfaces 36 of micro-channels 60 (such as shown in FIG. 1). In an embodiment, one or more of stamp surfaces 82 is irregular. Alternatively, as illustrated in FIG. 9, embossing stamp 80 has stamp substrate 81 with protruding stamp structures 83 with stamp surfaces 82, at least one of which is an at least partially curved stamp surface 82A. Thus, one or more of stamp surfaces 82 is an incident-light-diffusive surface.

As illustrated in the embodiments of FIGS. 8 and 9, embossing stamp 80 has stamp surfaces 82 that include one or more stamp side surfaces 82 intersecting stamp substrate 81. Side stamp surfaces 82 can be orthogonal to a surface of stamp substrate 81. Bottom stamp surface 82 intersects a side stamp surface 82 and not stamp substrate 81. Likewise, bottom stamp surface 82 has planar portions 36 that do not form an overhang (FIG. 8). Similarly, side stamp surface 82 does not form an overhang, as illustrated with angle G. Planar portions 36 can have normals 34 that are not parallel to each other, not parallel to a surface of stamp substrate 81, or not perpendicular to a surface of stamp substrate 81. This facilitates the formation of micro-channels 60 in cured layers 10, specifically by enabling removal of embossing stamp 80 from cured layer 10, as discussed further below and mentioned above. Thus, portions of stamp structures 83 that are further from stamp substrate 81 are not wider than portions of stamp structures 83 that are closer to stamp substrate 81.

Figure 10A:
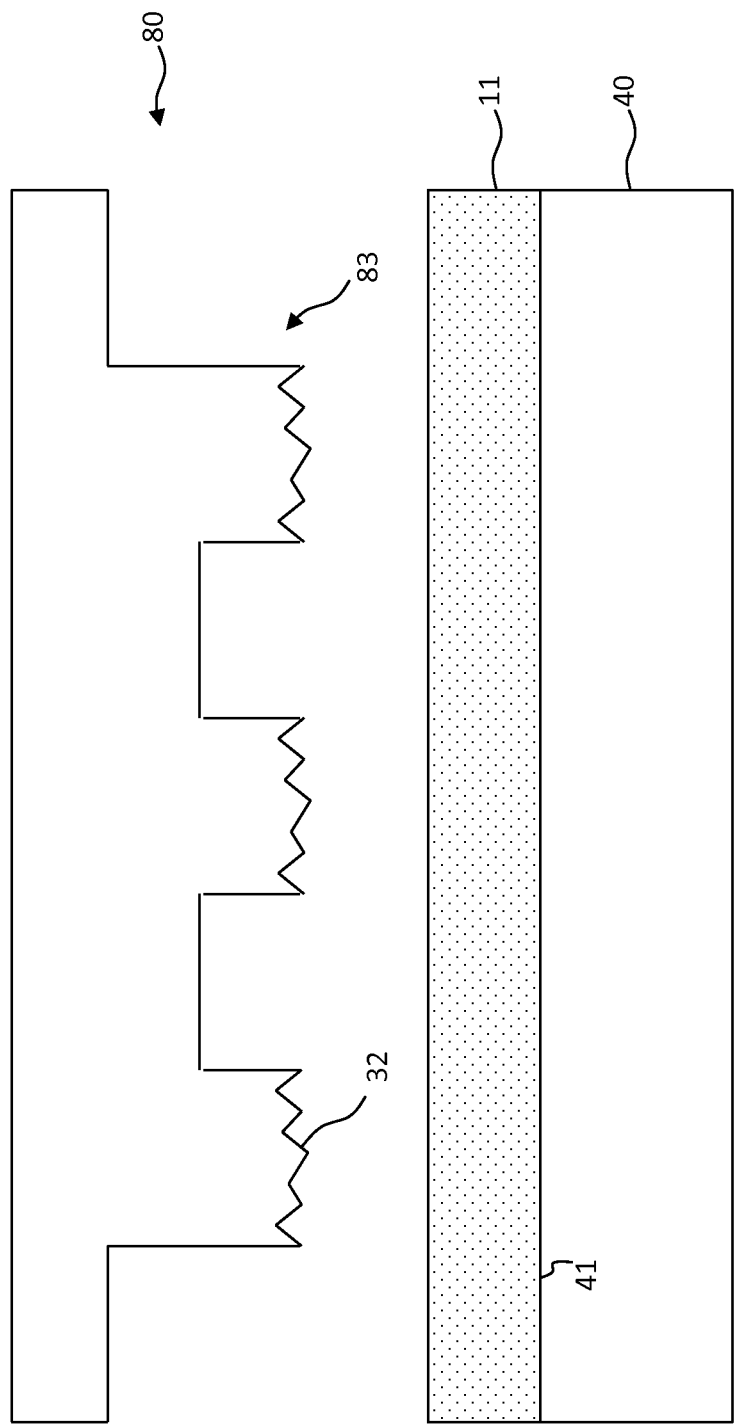
FIGS. 10A-10E are cross sections illustrating sequential steps in making a micro-channel of the present invention.
Figure 10B:
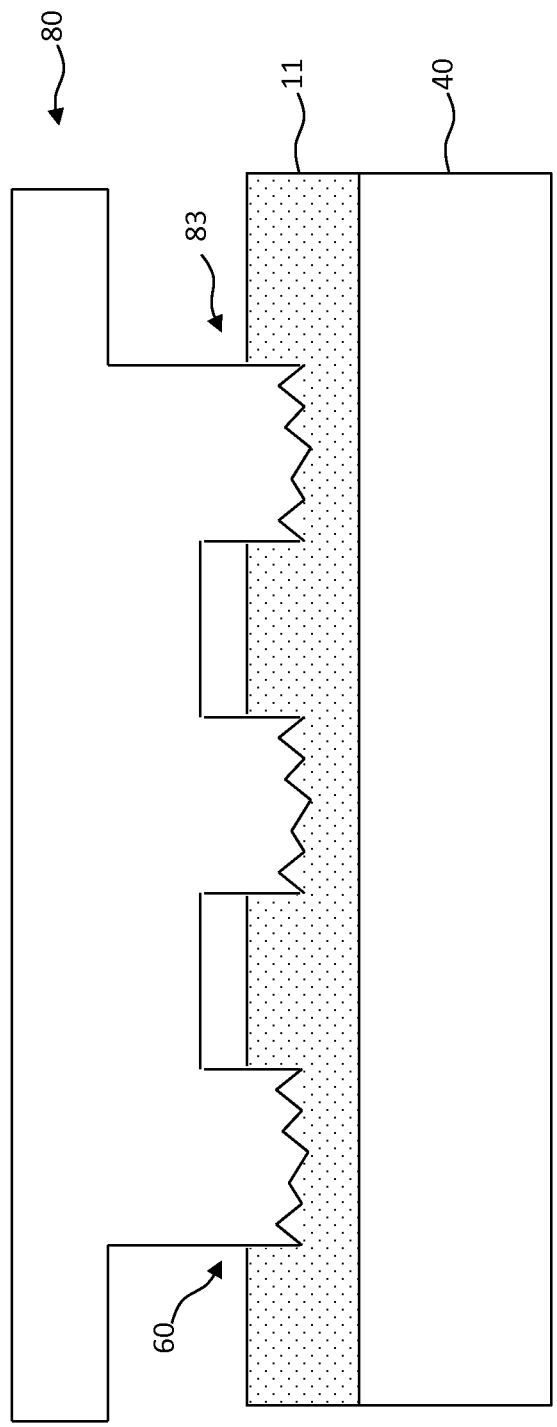
Figure 10C:
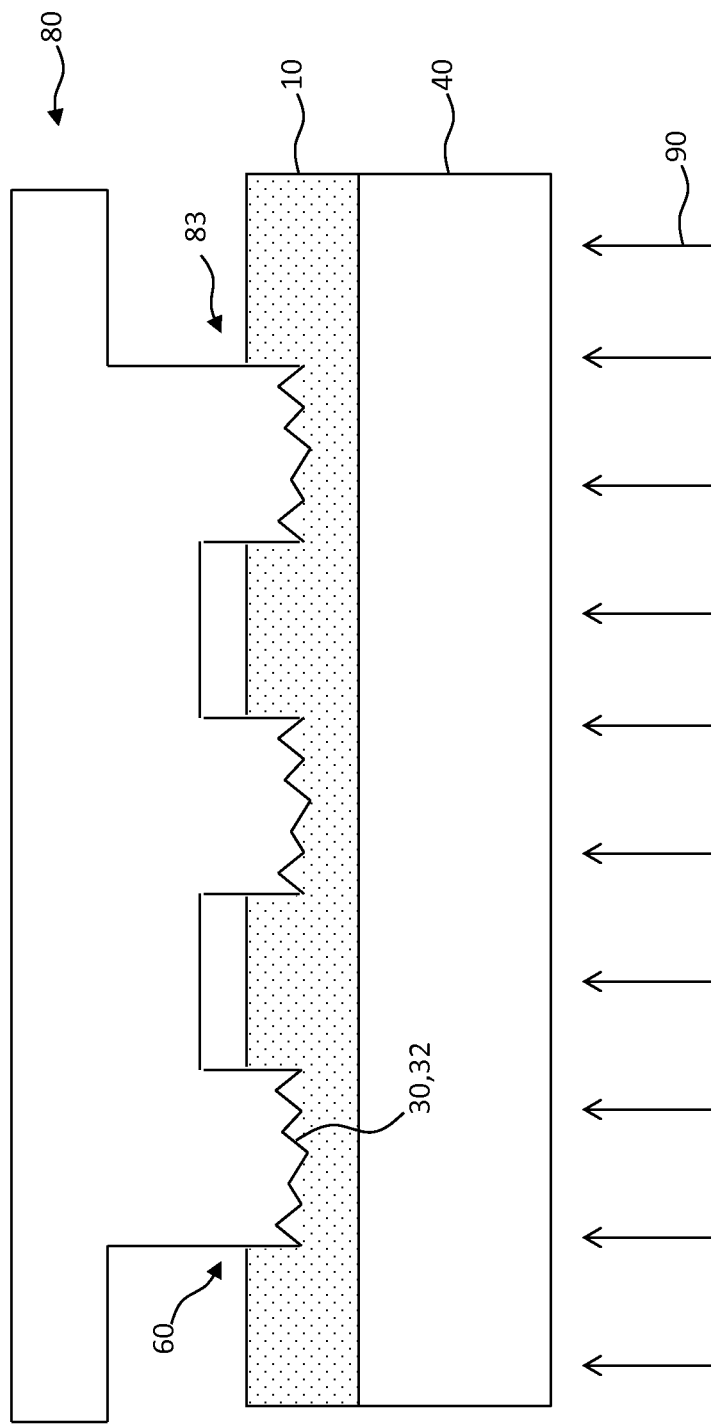
Figure 10D:
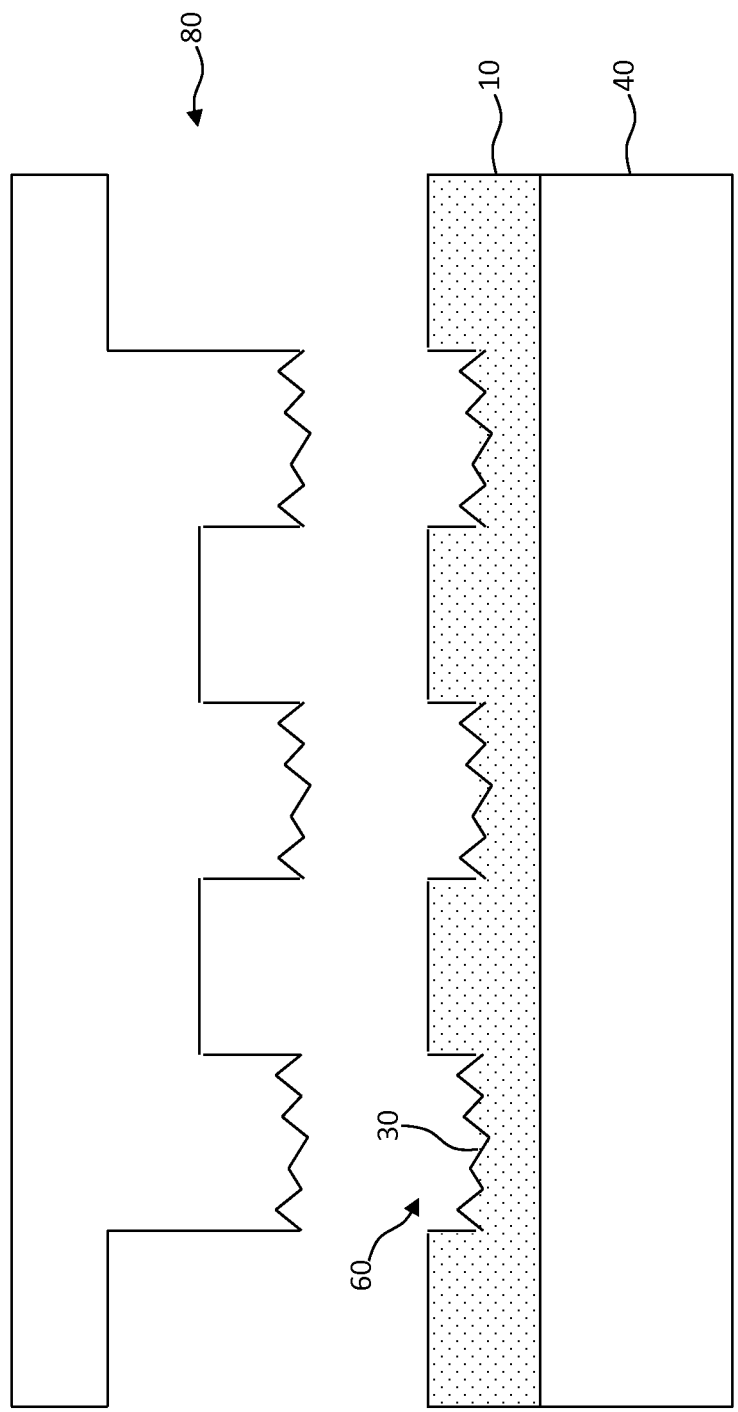
Figure 10E:
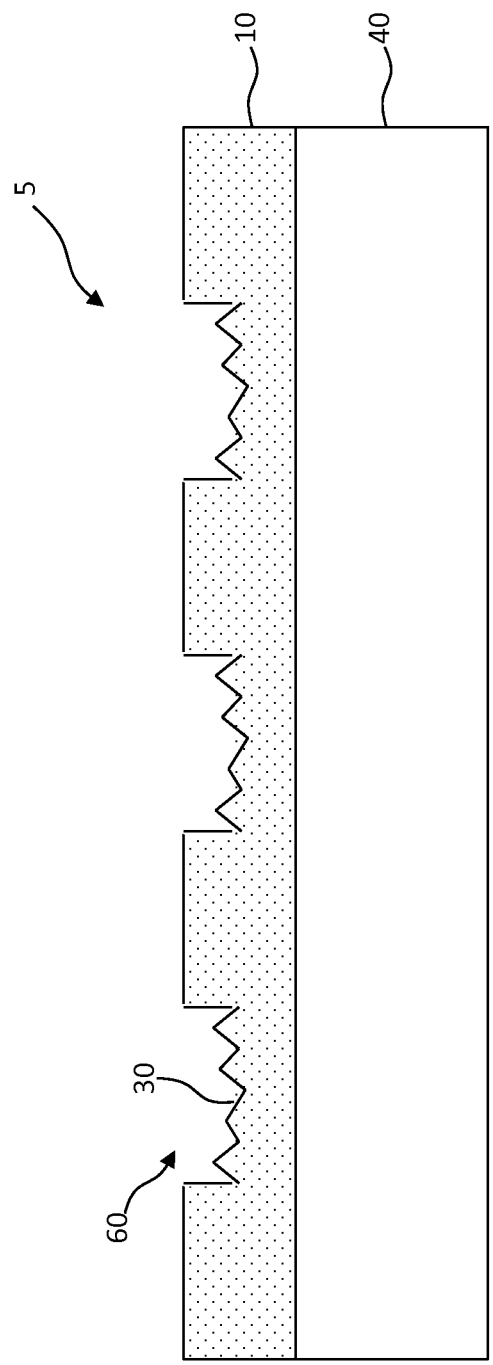

Referring to the sequential structures illustrated in FIGS. 10A to 10E and the flow diagram of FIG. 12, a method of making a micro-channel according to an embodiment of the present invention includes providing (Step 100) a substrate 40 having a substrate surface 41 and an embossing stamp 80 having stamp structures 83 with at least one non-planar stamp surface 32 (FIG. 10A). A curable layer 11 is coated (Step 105) on substrate surface 41 of substrate 40. Referring to FIG. 10B, stamp 80 is contacted (Step 110) to curable layer 11 so that stamp structures 83 of stamp 80 form embossed micro-channels 60 in curable layer 11. As shown in FIG. 10C, curable layer 11 is cured (Step 115) (for example with radiation 90 or heat) to form cured layer 10 on substrate 40 having embossed micro-channels 60 corresponding to stamp structures 83 of embossing stamp 80. Non-planar stamp surface 32 forms non-planar micro-channel surface 30. Embossing stamp 80 is removed (Step 120) from cured layer 10, as shown in FIG. 10D, leaving micro-channels 60 with non-planar micro-channel surface 30 formed in cured layer 10 on substrate 40 (FIG. 10E) to form an embossed micro-channel structure 5.

Figure 11A:
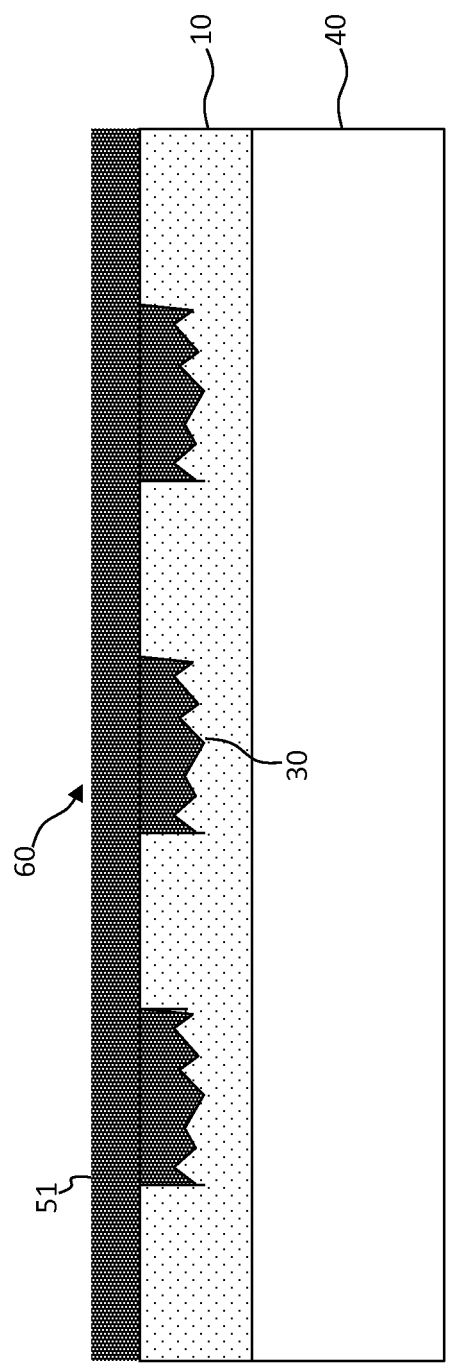
Figure 11B:
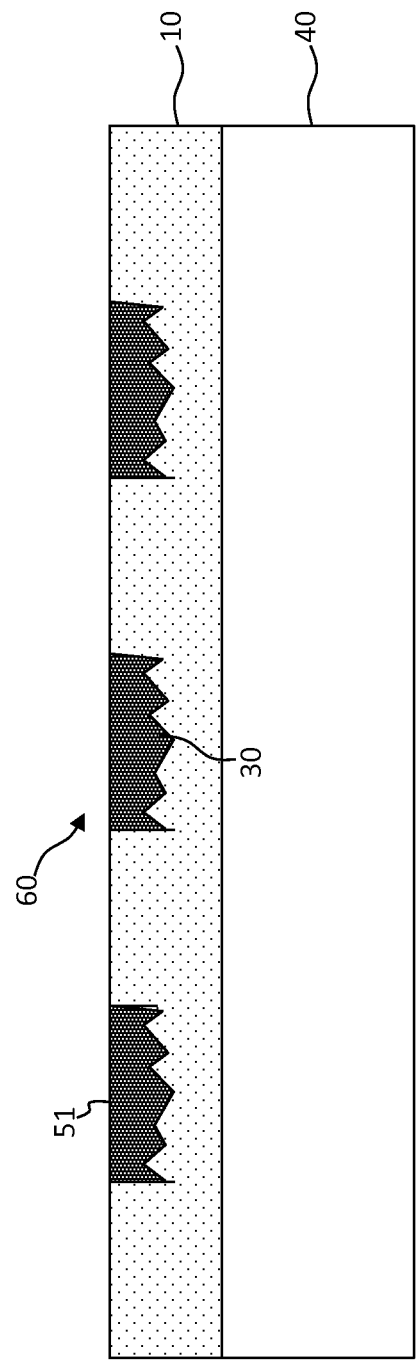
Figure 11D:
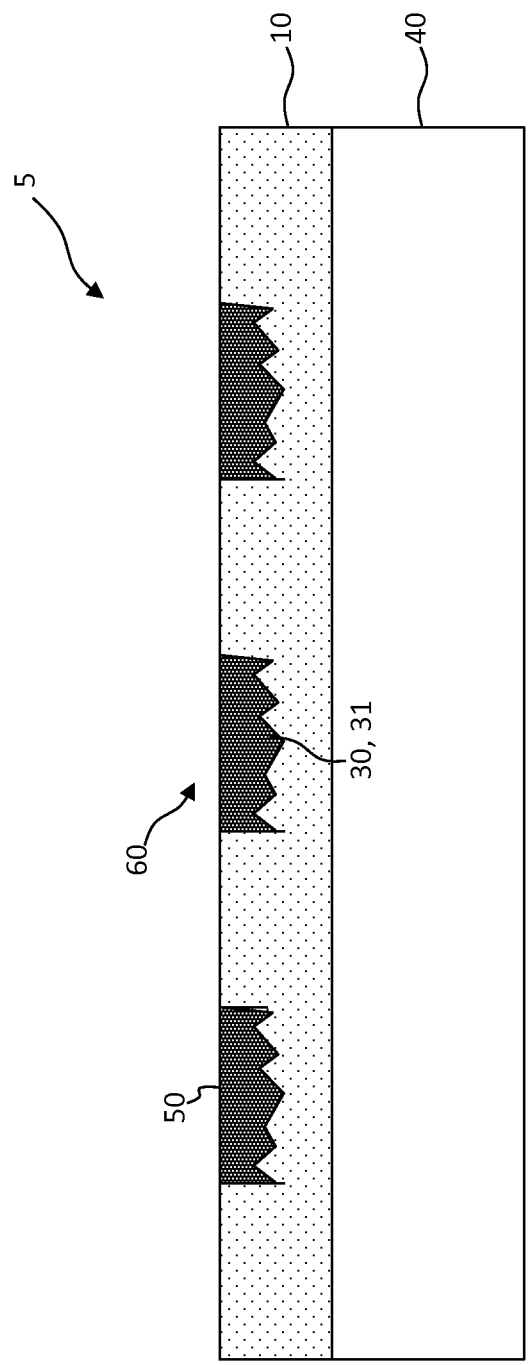

Referring next to FIG. 11A, cured layer 10 on substrate 40 having embossed micro-channels 60 and non-planar micro-channel surfaces 30 is coated (Step 125) with a curable conductive ink 51. The excess curable conductive ink 51 is removed (Step 130) (FIG. 11B) from cured layer 10 on substrate 40 and cured (Step 135) (FIG. 11C), for example with heat or radiation 90, to form micro-wires 50 having non-planar micro-wire surfaces 31 in micro-channels 60 having non-planar micro-channel surfaces 30 (FIG. 11D) in cured layer 10 on substrate 40 to form an embossed micro-channel structure 5 with micro-wires 50.

Embossed micro-channel structure 5 includes a plurality of micro-channels 60 embossed in cured layer 10 with micro-wire 50 formed in each micro-channel 60.

Figure 13A:
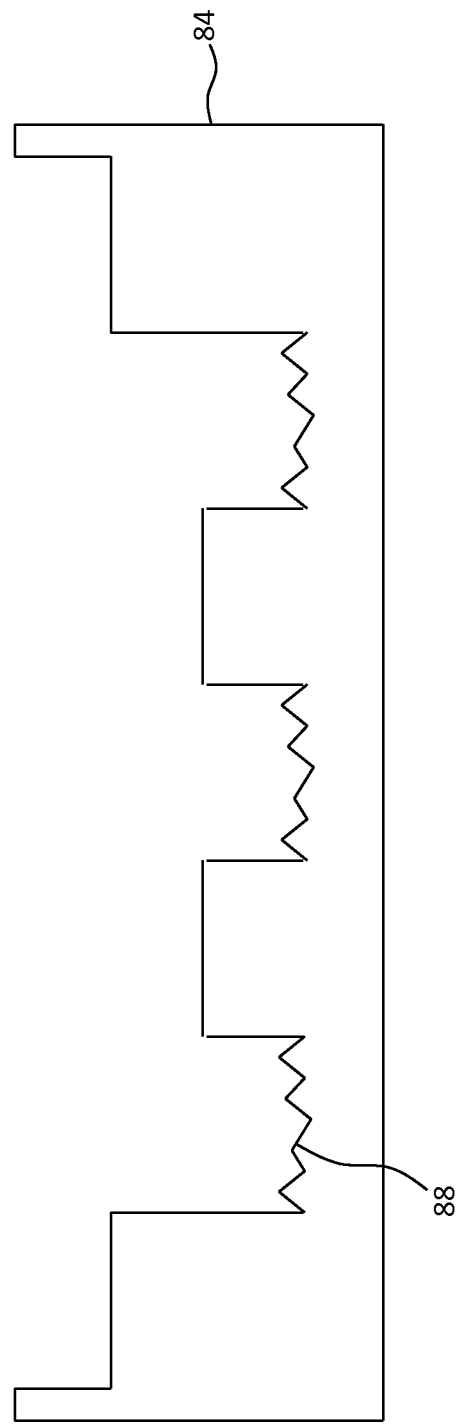
FIGS. 13A-13C are cross sections illustrating sequential steps in a method of the present invention.
Figure 13B:
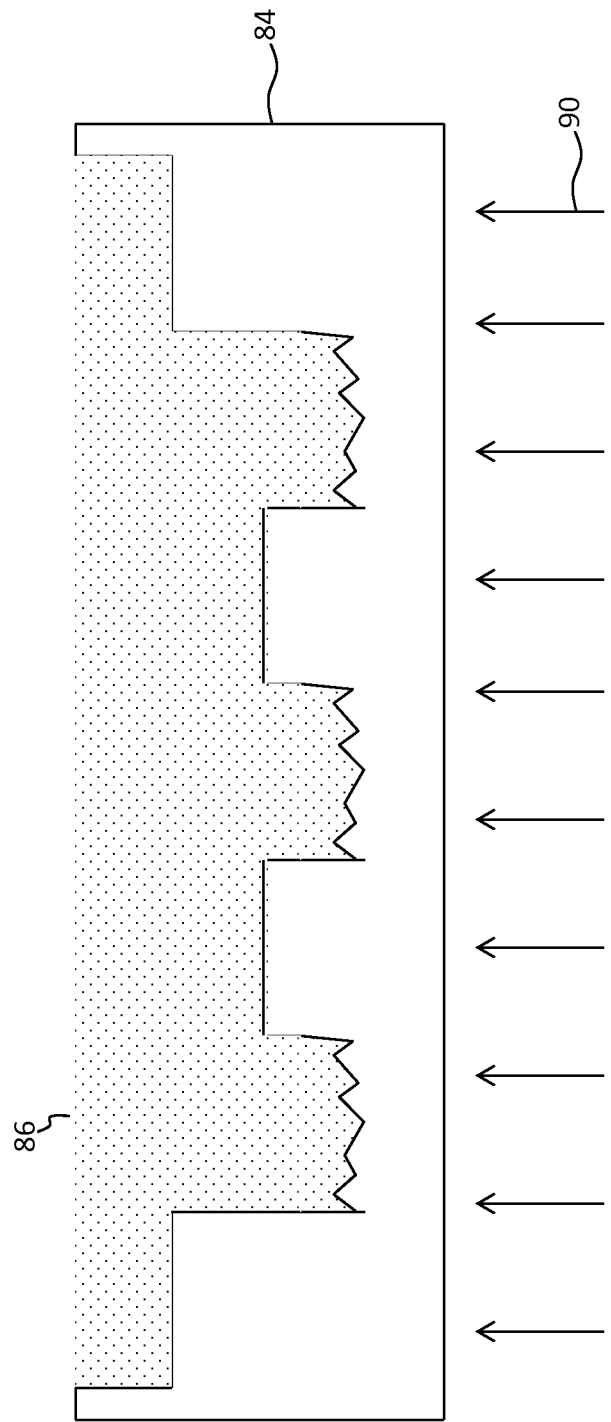
Figure 13C:
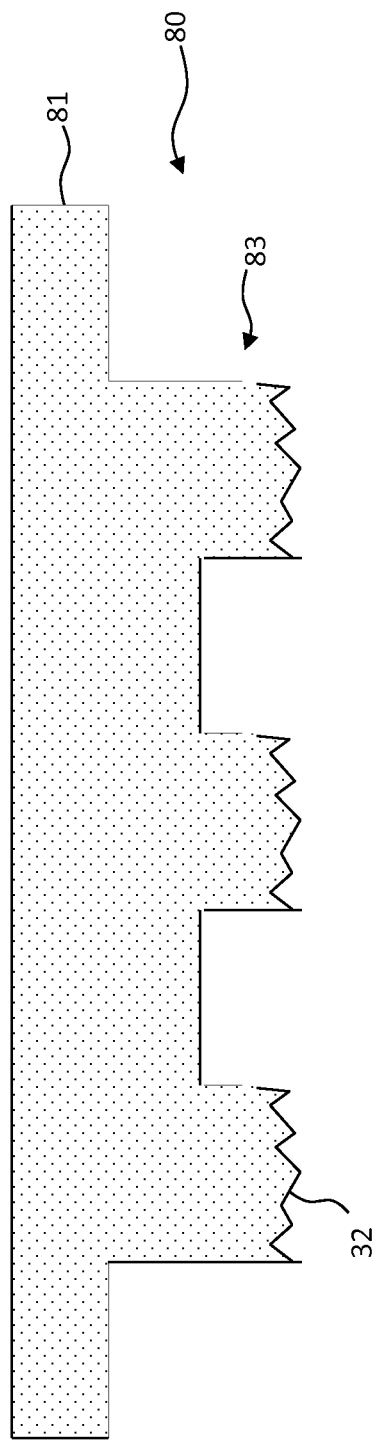
Figure 15:
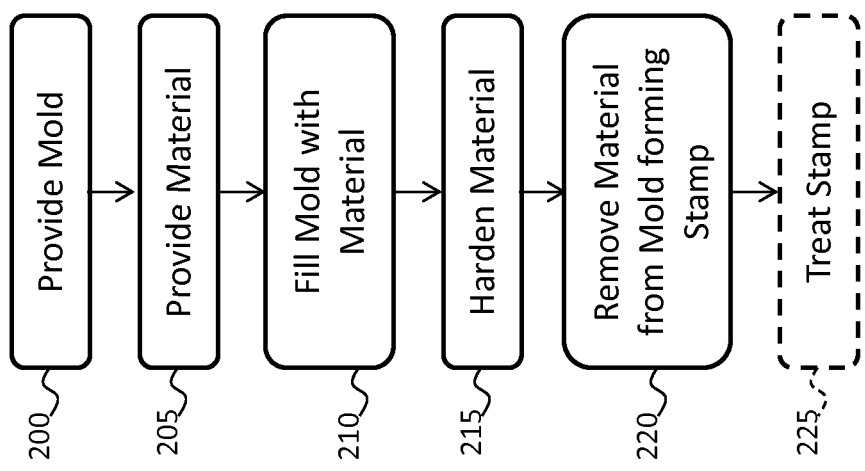
FIG. 15 is a flow diagram illustrating an embodiment of the present invention.

According to the present invention and as illustrated in FIGS. 13A to 13C and the flow diagram of FIG. 15, a method of making an embossing stamp 80 includes providing (Step 200) a mold 84 (FIG. 13A). Mold 84 has structures complementary to desired stamps structures 32 and can have a non-planar mold surface 88. A material 86 is provided 205 to fill (Step 210) mold 84 (FIG. 13B) and hardened (Step 215), for example by curing with radiation 90 or heat. Material 86 can be provided in a liquid form. Mold 84 is removed (Step 220)

forming stamp 80 (FIG. 13C) having the stamp substrate 81, stamp structures 83, and non-planar stamp surface 32.

Figure 14A:
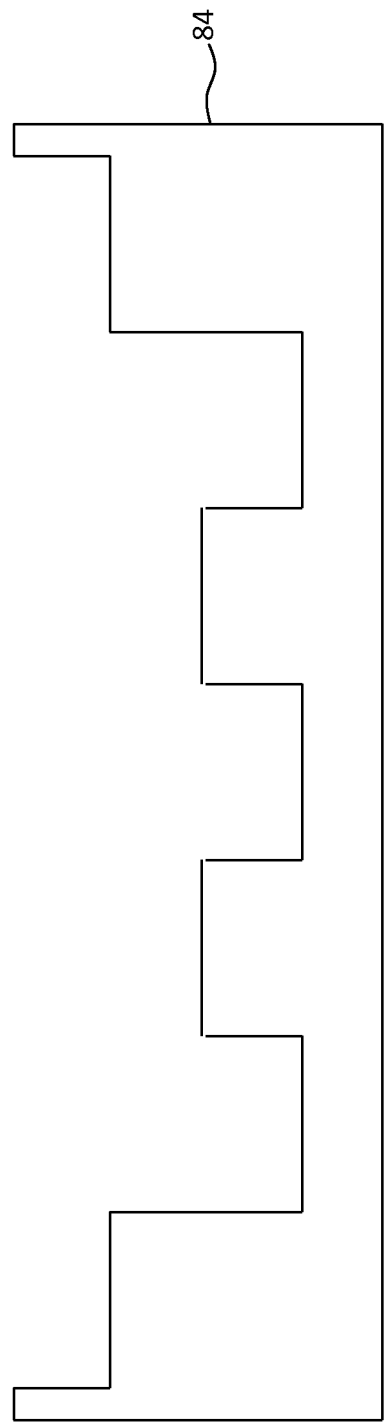
FIGS. 14A-14E are cross sections illustrating sequential steps in a method of the present invention.
Figure 14B:
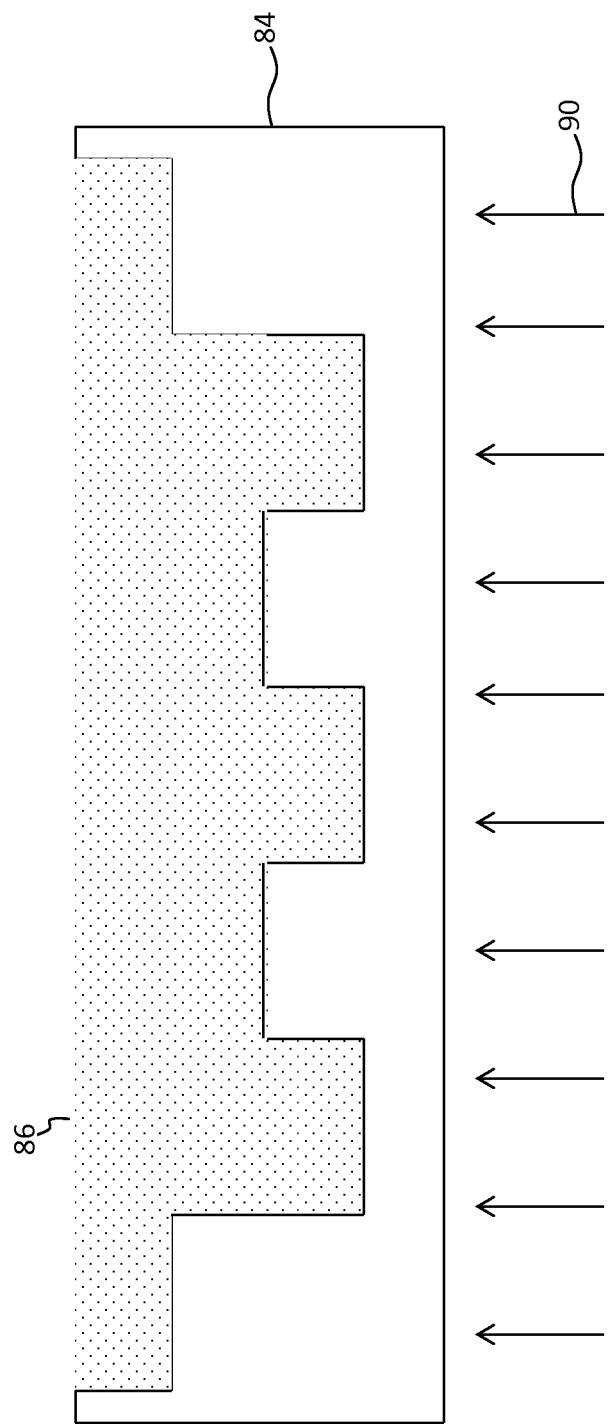
Figure 14C:
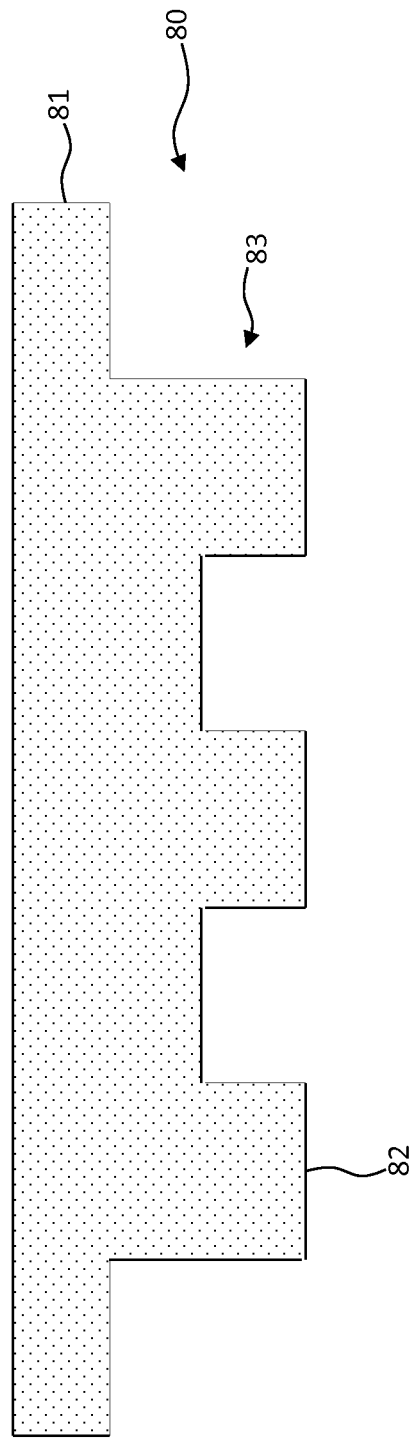
Figure 14D:
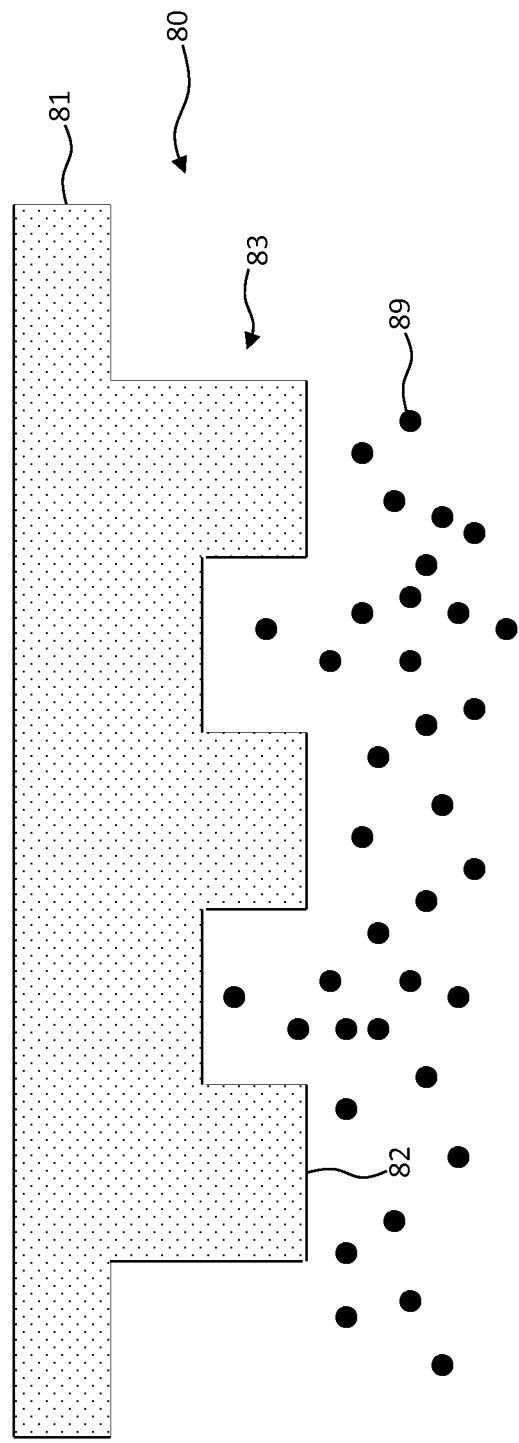
Figure 14E:
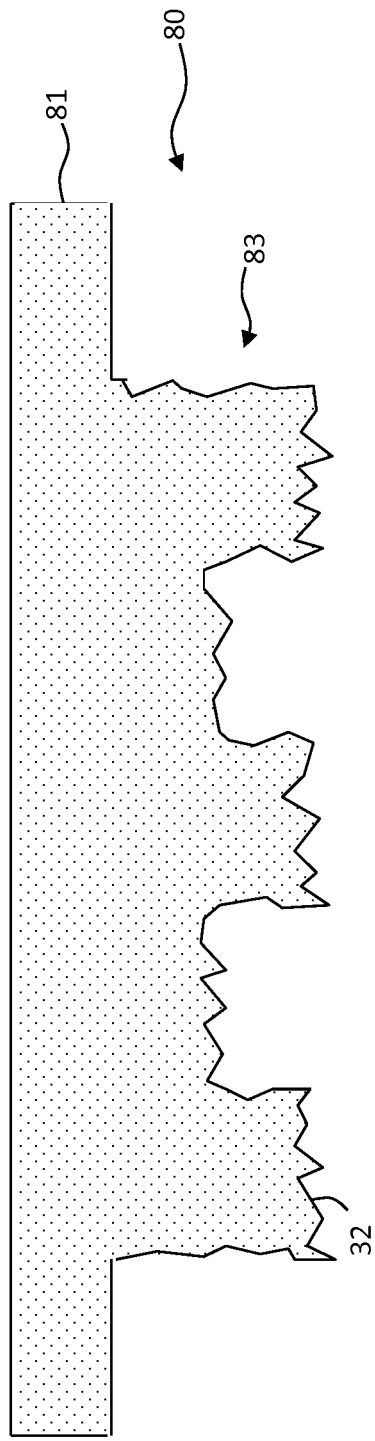

If stamp 80 does not have the non-planar stamp surface 32, one or more stamp surfaces 82 are treated (Step 225) to render them non-planar, forming non-planar stamp surface 32. For example, referring to FIGS. 14A to 14E and FIG. 15, a method of making an embossing stamp 80 includes providing (Step 200) the mold 84 (FIG. 14A). Mold 84 has structures complementary to desired stamp structures 83 (not shown) but does not have the non-planar mold surface 88. The stamp material 86 is provided (Step 205) to fill (Step 210) mold 84 (FIG. 14B) and hardened (Step 215), for example by curing with radiation 90 or heat. Mold 84 is removed (Step 220) forming stamp 80 (FIG. 14C) having a stamp substrate 81 and stamp structures 83 with stamp surfaces 82. Stamp surfaces 82 of stamp structures 83 are treated (Step 225) to render one or more of stamp surfaces 82 non-planar (FIG. 14D), forming non-planar stamp surface 32 (FIG. 14E). Treatment can include mechanical abrasion or exposure to energetic particles 89 or radiation, such as ozone, plasma, or corona discharge.

Figure 16:
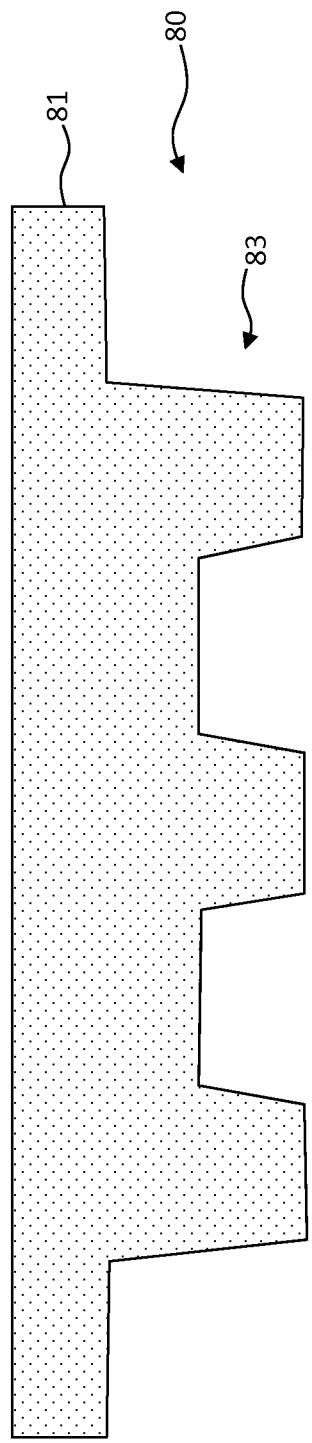
FIG. 16 is a cross section illustrating a structure useful with the present invention.

As shown in FIG. 16, embossing stamp 80 can include stamp structures 83 or portions of stamp structures 83 closer to stamp substrate 81 that are at least as wide or wider than stamp structures 83 or portions of stamp structures 83 farther from stamp substrate 81. This facilitates removal of embossing stamp 80 from cured layer 10.

In various embodiments, depth D of micro-channel 60 is in the range of about two microns to ten microns, width W of micro-channel 60 is in the range of about two microns to twelve microns, and the thickness of cured layer 10 is in the range of about four microns to twelve microns.

Cured layer 10 useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated. In an embodiment of the present invention, cured layer 10 includes a curable resin, for example an ultra-violet-light-sensitive polymer such as SU8 (available from MicroChem).

Curing curable layer 11 includes drying, heating, or radiating curable layer 11 to form cured layer 10. In an embodiment, cured layer 10 is a layer that is embossed and cured in a single step. In another embodiment, the embossing step and the curing step are different single steps. For example, curable layer 11 is embossed in a first step using a stamping method known in the art and cured in a second different step, e.g. by heat or exposure to radiation. In another embodiment, embossing and curing curable layer 11 is done in a single common step.

Curable layer 11 can be deposited as a single layer using coating methods known in the art, such as curtain, spray, or dip coating. In an alternative embodiment, curable layer 11 can be deposited as multiple sub-layers using multi-layer deposition methods known in the art, such as multi-layer slot coating, repeated curtain coatings, or multi-layer extrusion coating. In yet another embodiment, curable layer 11 includes multiple sub-layers formed in different, separate steps, for example with a multi-layer extrusion, curtain coating, or slot coating machine as is known in the coating arts.

When a molding device, such as embossing stamp 80 having a reverse micro-channel stamp structure 83 is applied to liquid curable material in curable layer 11 coated on substrate 40 and the cross-linking agents in the curable material are activated, the liquid curable material in curable layer 11 is hardened into cured layer 10 having micro-channels 60. The liquid curable materials can include a surfactant to assist in controlling coating on substrate 40. Materials, tools, and methods are known for embossing coated liquid curable materials to form cured layers 10 having conventional micro-channels.

Curable inks useful in the present invention are known and can include conductive inks having electrically conductive metal particles or nano-particles, such as silver nano-particles. The electrically conductive nano-particles can be metallic or have an electrically conductive shell. The electrically conductive nano-particles can include silver or a silver alloy or other metals, such as tin, tantalum, titanium, gold, copper, or aluminum, or alloys thereof. Cured inks can include light-absorbing materials such as carbon black, a dye, or a pigment. The metal nano-particles can be sintered to form a metallic electrical conductor. Curing a conductive ink includes heating, drying, radiating, sintering, welding, or agglomerating particles in the conductive ink.

The cured electrical conductor forming micro-wires 50 can include electrically conductive nano-particles, for example silver nano-particles. The nano-particles can be sintered, welded, or agglomerated together, for example by curing with heat. In various non-limiting embodiments, the conductive nano-particles can be deposited as a liquid, for example an aqueous solution containing conductive nano-particles, as a slurry, or as a powder. If deposited in liquid form, the liquid can be cured by drying, for example with heat. The cured electrical conductor can be porous or solid. The electrically conductive nano-particles can include metal, metal alloys, or particles with a metal or metal alloy shell. The cured electrical conductor (micro-wires 50) can be adhered to the transfer material or the cured layer. Curing the electrical conductor includes drying, heating, or radiating the electrical conductor.

In an embodiment, curable inks provided in a liquid form are deposited or located in micro-channels 60 and cured, for example by heating or exposure to radiation such as infra-red, visible light, or ultra-violet radiation. The curable ink hardens to form the cured ink that makes up micro-wires 50. For example, a curable conductive ink with conductive nano-particles can be located within micro-channels 60 and heated to agglomerate, weld, or sinter the nano-particles, thereby forming an electrically conductive micro-wire 50. Materials, tools, and methods are known for coating liquid curable inks, for example by dip, curtain, or spray coating to form micro-wires 50 in conventional single-layer micro-channels.

In an embodiment, a curable ink can include conductive nano-particles in a liquid carrier (for example an aqueous solution including surfactants that reduce flocculation of metal particles, humectants, thickeners, adhesives or other active chemicals). The liquid carrier can be located in micro-channels 60 and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in micro-wire 50 formation process.

According to various embodiments of the present invention, substrate 40 is any material having the substrate surface 41 on which the cured layer 10 can be formed. Substrate 40 can be a rigid or a flexible substrate made of, for example, a glass, metal, plastic, or polymer material, can be transparent, and can have opposing substantially parallel and extensive surfaces. Substrates 40 can include a dielectric material useful for capacitive touch screens and can have a wide variety of thicknesses, for example 10 microns, 50 microns, 100 microns, 1 mm, or more. In various embodiments of the present invention, substrates 40 are provided as a separate structure or are coated on another underlying substrate, for example by coating a polymer substrate layer on an underlying glass substrate.

Substrate 40 can be an element of other devices, for example the cover or substrate of a display or a substrate, cover, or dielectric layer of a touch screen. According to embodiments of the present invention, micro-wires 50 extend across at least a portion of substrate 40 in a direction parallel to substrate surface 41 of substrate 40. In an embodiment, the substrate 40 of the present invention is large enough for a user to directly interact therewith, for example using an implement such as a stylus or using a finger or hand. Methods are known in the art for providing suitable surfaces on which to coat a single curable layer 11. In a useful embodiment, substrate 40 is substantially transparent, for example having a transparency of greater than 90%, 80% 70% or 50% in the visible range of electromagnetic radiation.

Electrically conductive micro-wires 50 having non-planar surfaces and methods of the present invention are useful for making electrical conductors and busses for transparent micro-wire electrodes and electrical conductors in general, for example as used in electrical busses. A variety of micro-wire patterns can be used and the present invention is not limited to any one pattern. Micro-wires 50 can be spaced apart, form separate electrical conductors, or intersect to form a mesh electrical conductor on or in substrate 40. Micro-channels 60 can be identical or have different sizes, aspect ratios, or shapes. Similarly, micro-wires 50 can be identical or have different sizes, aspect ratios, or shapes. Micro-wires 50 can be straight or curved.

A micro-channel 60 is a groove, trench, or channel formed on or in cured layer 10 extending from cured-layer surface 12 toward substrate surface 41 of substrate 40 and having a cross-sectional width W less than 20 microns, for example 10 microns, 5 microns, 4 microns, 3 microns, 2 microns, 1 micron, or 0.5 microns, or less. In an embodiment, cross-sectional depth D of micro-channel 60 is comparable to width W. Micro-channels 60 can have a rectangular cross section, as shown. Other cross-sectional shapes, for example trapezoids, are known and are included in the present invention. The width or depth of a layer is measured in cross section.

In an example and non-limiting embodiment of the present invention, each micro-wire 50 is from 10 to 15 microns wide, from 5 to 10 microns wide, or from one micron to five microns wide. In some embodiments, micro-wire 50 can fill micro-channel 60; in other embodiments micro-wire 50 does not fill micro-channel 60. In an embodiment, micro-wire 50 is solid; in another embodiment micro-wire 50 is porous.

Micro-wires 50 can be metal, for example silver, gold, aluminum, nickel, tungsten, titanium, tin, or copper or various metal alloys including, for example silver, gold, aluminum, nickel, tungsten, titanium, tin, or copper. Micro-wires 50 can include a thin metal layer composed of highly conductive metals such as gold, silver, copper, or aluminum. Other conductive metals or materials can be used. Alternatively, micro-wires 50 can include cured or sintered metal particles such as nickel, tungsten, silver, gold, titanium, or tin or alloys such as nickel, tungsten, silver, gold, titanium, or tin. Conductive inks can be used to form micro-wires 50 with pattern-wise deposition or pattern-wise formation followed by curing steps. Other materials or methods for forming micro-wires 50, such as curable ink powders including metallic nano-particles, can be employed and are included in the present invention.

Electrically conductive micro-wires 50 of the present invention can be operated by electrically connecting micro-wires 50 to electrical circuits that provide electrical current to micro-wires 50 and can control the electrical behavior of micro-wires 50. Electrically conductive micro-wires 50 of the present invention are useful, for example in touch screens such as projected-capacitive touch screens that use transparent micro-wire electrodes and in displays. Electrically conductive micro-wires 50 can be located in areas other than display areas, for example in the perimeter of the display area of a touch screen, where the display area is the area through which a user views a display.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are all well known. All of these tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

A cross section
B cross section
D depth
G angle
W width
L length
5 embossed micro-channel structure
10 cured layer
11 curable layer
12 cured-layer surface
30 non-planar micro-channel surface
31 non-planar micro-wire surface
32 non-planar stamp surface
34 normal
36 planar portion
40 substrate 41 substrate surface
50 micro-wire
51 curable conductive ink
60 micro-channel
62 micro-channel bottom
64 micro-channel side
80 embossing stamp
81 stamp substrate
82 stamp surface
82A curved stamp surface
83 stamp structure
84 mold
86 stamp material
88 non-planar mold surface
89 energetic particles
90 radiation
100 provide substrate and stamp step
105 coat substrate with curable layer step
110 contact stamp to curable layer step
115 cure curable layer step
120 remove stamp step
125 coat embossed substrate with conductive ink step
130 remove excess conductive ink step
135 cure conductive ink step
200 provide mold step
205 provide material step
210 fill mold with material step
215 harden material step
220 remove material from mold forming stamp step
225 optional treat stamp step

The invention claimed is:

1. An embossing stamp, comprising:
a stamp substrate having a planar surface;
two or more stamp structures formed on the stamp substrate having stamp surfaces extending from the stamp substrate to emboss a micro-channel in a layer, wherein at least one of the stamp surfaces forming the micro-channel is non-planar and incident-light-diffusive;
portions of the embossing stamp between the stamp structures, wherein all of the portions have only flat and incident-light-non-diffusive surfaces; and
wherein the stamp surfaces include one or more stamp side surfaces intersecting the stamp substrate and a stamp bottom surface intersecting a stamp side surface and not the stamp substrate.

2. The embossing stamp of claim 1, wherein stamp structures closer to the stamp substrate are wider than stamp structures farther from the stamp substrate.

3. The embossing stamp of claim 1, wherein two or more of the stamp surfaces have surface normals that are not parallel.

4. The embossing stamp of claim 1, wherein two or more of the stamp surfaces have surface normals that are parallel.

5. The embossing stamp of claim 1, wherein one or more of the stamp surfaces is at least partially curved.

6. The embossing stamp of claim 1, wherein one or more of the stamp surfaces is irregular.

7. The embossing stamp of claim 1, wherein the incident-light-diffusive surface has planar portions that have a dimension less than or equal to 100 microns.

8. The embossing stamp of claim 1, wherein only the stamp bottom surface is non-planar.

9. The embossing stamp of claim 1, wherein only the stamp bottom surface is incident-light diffusive.

10. The embossing stamp of claim 1, wherein at least a portion of the stamp bottom surface is at least as far from the stamp substrate as at least one of the stamp side surfaces.

11. The embossing stamp of claim 1, wherein stamp side surfaces extend a common distance from the stamp substrate.

12. A method of making an embossing stamp, comprising:
providing a material; and
forming the material into an embossing stamp having a stamp substrate and one or more stamp structures, the one or more stamp structures having stamp surfaces extending from the stamp substrate, wherein at least one of the stamp surfaces is non-planar; one or more portions of the embossing stamp between the stamp structures, wherein the one or more portions are flat and incident-light-non-diffusive; and wherein the stamp surfaces include one or more stamp side surfaces intersecting the stamp substrate and a stamp bottom surface intersecting a stamp side surface and not the stamp substrate; and wherein one or more of the stamp surfaces is an incident-light-diffusive surface.

13. The method of claim 12, wherein stamp structures closer to the stamp substrate are at least as wide or wider than stamp structures farther from the stamp substrate.

14. The method of claim 12, further including:
first forming the material into an embossing stamp having a stamp substrate and stamp structures, the stamp structures having stamp surfaces extending from the stamp substrate, wherein the stamp surfaces are planar; and
second treating one or more stamp surfaces to render one or more stamp surfaces non-planar.

15. The method of claim 14, wherein treating the one or more stamp surfaces includes mechanically abrading the one or more stamp surfaces.

16. The method of claim 14, wherein treating the one or more stamp surfaces includes plasma treating the one or more stamp surfaces.

17. The method of claim 14, wherein treating the one or more stamp surfaces includes exposing the one or more stamp surface to a corona discharge.

18. The method of claim 14, wherein forming the embossing stamp further includes:
providing a liquid material in the mold; and
curing the liquid material.

19. The method of claim 14, wherein forming the embossing stamp further includes providing a mold having one or more mold surfaces at least one of which is non-planar.

* * * * *